United States Patent
Hess et al.

(10) Patent No.: US 6,857,554 B2
(45) Date of Patent: Feb. 22, 2005

(54) METHOD AND DEVICE FOR DETERMINING THE VECTORIAL DISTANCE BETWEEN THE CAPILLARY AND THE IMAGE RECOGNITION SYSTEM OF A WIRE BONDER

(75) Inventors: Peter Hess, Walchwil (CH); Markus Michler, Feldkirch (AT); Nicolino Onda, Bad Raguz (CH)

(73) Assignee: ESEC Trading SA, Cham (CH)

( * ) Notice: Subject to any disclaimer, the term of this patent is extended or adjusted under 35 U.S.C. 154(b) by 140 days.

(21) Appl. No.: 10/391,410

(22) Filed: Mar. 18, 2003

(65) Prior Publication Data

US 2003/0178469 A1 Sep. 25, 2003

(30) Foreign Application Priority Data

Mar. 19, 2002 (CH) .............................................. 0487/02

(51) Int. Cl.⁷ .............................................. B23K 31/02
(52) U.S. Cl. ..................................... 228/103; 228/180.5
(58) Field of Search ................................ 228/102, 103, 228/110.1, 180.5, 4.5, 8; 356/153, 614, 615, 622

(56) References Cited

U.S. PATENT DOCUMENTS

| | | | |
|---|---|---|---|
| 3,840,169 A | * 10/1974 | Steranko et al. | ............. 228/4.1 |
| 4,445,633 A | * 5/1984 | Bonham, Jr. | ................. 228/102 |
| 4,855,928 A | 8/1989 | Yamanaka | |
| 5,037,023 A | 8/1991 | Akiyama et al. | |
| 5,615,821 A | * 4/1997 | Sasano | ........................ 228/102 |
| 2001/0011669 A1 | 8/2001 | Hayata et al. | |

FOREIGN PATENT DOCUMENTS

JP   10189118   1/2000

* cited by examiner

Primary Examiner—Jonathan Johnson
(74) Attorney, Agent, or Firm—McCormick, Paulding & Huber LLP

(57) ABSTRACT

To determine the vectorial distance D between the tip of a capillary and an optical axis of an image recognition system of a Wire Bonder, a glass fibre supplied with light is used as a reference point and as a sensor. On the one hand, the glass fibre serves as a reference point with which the position of the optical axis of the image recognition system can be determined. On the other hand, the glass fibre serves as a sensor with which the position of the tip of the capillary can be determined in that it is determined at which position of the bondhead the intensity of the light which is reflected back into the glass fibre by a wire ball formed at the tip of the capillary is at a maximum.

2 Claims, 1 Drawing Sheet

Figure 1:
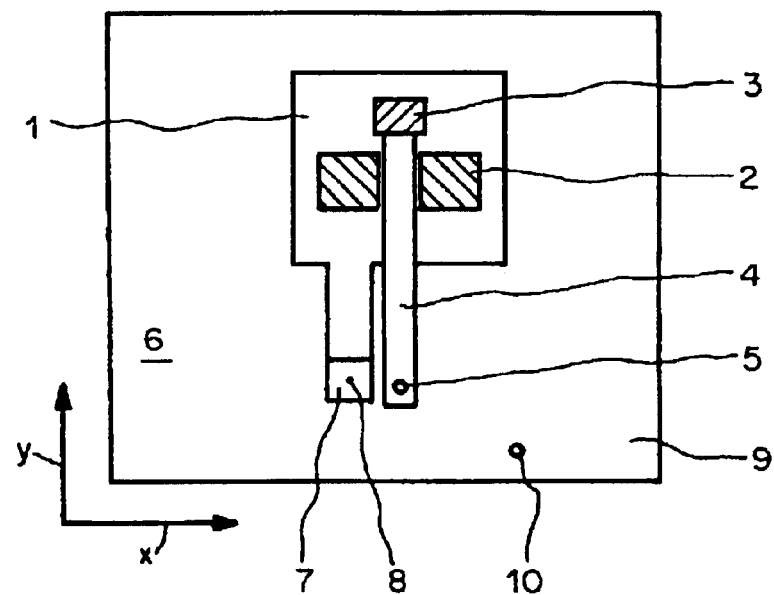

METHOD AND DEVICE FOR DETERMINING THE VECTORIAL DISTANCE BETWEEN THE CAPILLARY AND THE IMAGE RECOGNITION SYSTEM OF A WIRE BONDER

PRIORITY CLAIM

The present application claims priority under 35 U.S.C §119 based upon Swiss Patent Application No. 2002 0487/02 filed on Mar. 19, 2002.

FIELD OF THE INVENTION

The invention concerns a method for determining the vectorial distance between the capillary and the image recognition system of a Wire Bonder and a Wire Bonder with a device suitable for this purpose.

BACKGROUND OF THE INVENTION

A Wire Bonder is an automatic machine with which semiconductor chips are wired to a substrate after mounting. The Wire Bonder has a capillary which is clamped to the tip of a horn. The capillary serves to secure the wire to a connection point on the semiconductor chip and to a connection point on the substrate as well as to guide the wire between the two connection points. The position of the connection points is determined prior to bonding by means of an image recognition system so that the capillary impinges at the right location on the connection point. However, during operation, a problem exists in that the distance between the capillary and the optical axis of the image recognition system can change in an unpredictable manner because of thermal effects. The distance therefore has to be continuously re-calibrated.

SUMMARY OF THE INVENTION

The object of the invention is to develop a measuring system with which the distance between the capillary and the optical axis of the image recognition system can be determined in a simple and reliable way.

For determining the vectorial distance D between the tip of a capillary and an optical axis of an image recognition system of a Wire Bonder in accordance with the invention, a glass fibre supplied with light is used as a reference point and as a sensor. On the one hand, an end of the glass fibre serves as a reference point with which the position of the optical axis of the image recognition system can be determined. On the other hand, the end of the glass fibre serves as a sensor with which the position of the tip of the capillary can be determined in that it is ascertained at which position of the bondhead the intensity of the light which is reflected back into the glass fibre from a wire ball formed at the tip of the capillary is at a maximum. Determining the vectorial distance D comprises the following procedural steps:

Formation of a wire ball at the tip of the capillary;

Moving the bondhead in such a way that the capillary is moved over one end of the glass fibre, the other end of which being supplied with light from a light source, in order to determine first co-ordinates at which the bondhead must be positioned in order that the intensity of the light reflected by the wire ball back into the glass fibre is at a maximum;

Moving the bondhead in order to bring the end of the glass fibre into the field of vision of the image recognition system and determining second co-ordinates at which the bondhead must be positioned in order that the optical axis of the image recognition system passes through the centre of the glass fibre; and Determining the vectorial distance D from the first and second co-ordinates.

BRIEF DESCRIPTION OF THE DRAWING FIGURES.

The accompanying drawings, which are incorporated into and constitute a part of this specification, illustrate one or more embodiments of the present invention and, together with the detailed description, serve to explain the principles and implementations of the invention. The figures are not to scale.

Figure 2:
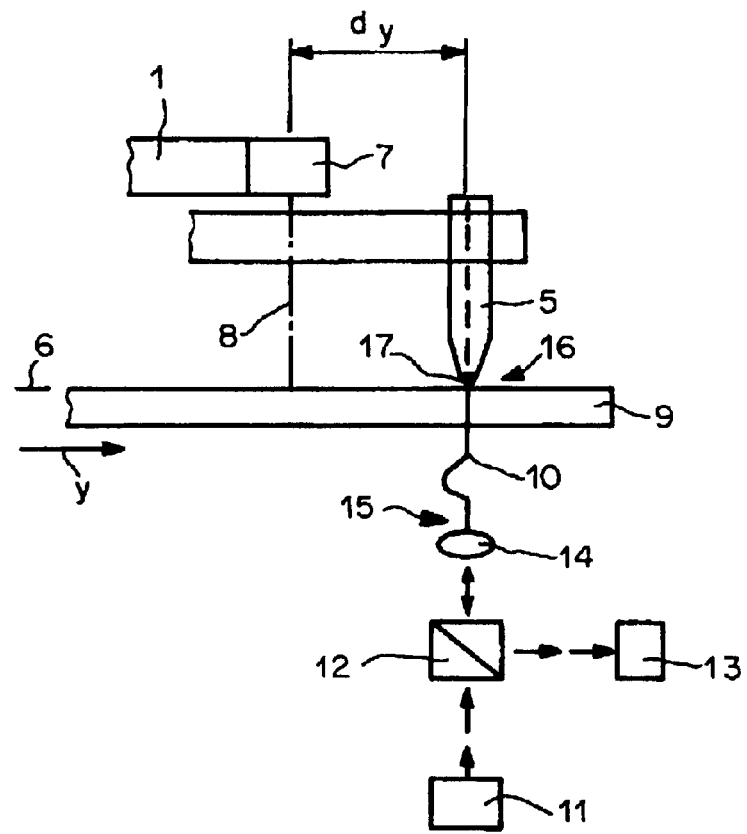

In the drawings:

FIG. 1 shows a plan view of a bondhead of a Wire Bonder with a capillary, an image recognition system and a device for determining the vectorial distance between the capillary and the optical axis of the image recognition system, and FIG. 2 shows a cross-section of the device.

DESCRIPTION OF THE PREFERRED EMBODIMENTS

FIG. 1 shows schematically a plan view of a bondhead 1 of a Wire Bonder. The bondhead 1 comprises a rocker 2 which can be rotated on a horizontal axis. A horn 4, to which ultrasonics can be applied from a ultrasonic transducer 3, is attached to the rocker 2. A capillary 5 is clamped to the tip of the horn 4. The capillary 5 serves to secure a wire to a connection point on a semiconductor chip and to an assigned connection point on a substrate as well as to guide the wire between the two connection points. The bondhead 1 enables movement of the capillary 5 in a plane 6 defined by means of the two co-ordinate axes x and y, while the rocker 2 enables movement vertically to the plane 6. In addition, the Wire Bonder has an image recognition system the field of vision of which is directed to the plane 6 and which serves to measure the position of the connection points on the semiconductor chip and on the substrate. The image recognition system comprises a camera 7 and an image analysis system. The image recognition system has an optical axis 8 which runs vertically to the plane 6. In the example presented, the camera 7 is secured to the bondhead 1 and its field of vision is directly directed to the plane 6. In the example, the optical axis 8 of the image recognition system coincides with the optical axis of the camera 7. However, the use of additional optical components such as lenses, mirrors, prisms, etc., can be necessary or desired in order to guide the beam path and/or to be able to change the size of the field of vision of the image recognition system.

The bondhead 1 slides for example on an air bearing preloaded with vacuum on a gliding plate 9. A bondhead 1 of this type which is moveable in x or y direction by means of two electromagnetic drives is known from U.S. Pat. No. 5,114,302. A further bondhead 1 of this type which has a linear and a rotational drive in order to move the capillary 5 in the plane 6 is known from U.S. Pat. No. 6,460,751. However, it is also known to move the bondhead 1 by means of an x-y table. The position of the bondhead 1 in the plane 6 is acquired in a well-known manner by means of a measuring system, for example an optical measuring system.

The invention is explained based on the example of Cartesian xy co-ordinates. In order that the capillary 5 can always be placed at the right location on the respective connection point, those co-ordinates $(x_1, y_1)$ at which the bondhead 1 had to be placed in order that the optical axis 8 of the image recognition system passes through the desired impact point of the capillary 5 on the connection point are first determined by means of the image recognition system. The co-ordinates $(x_2, y_2)$ at which the bondhead 1 has to be placed in order that the tip of the capillary 5 impacts at the desired point of impact result from these co-ordinates $(x_1, y_1)$ by means of adding a vector $D=(d_X, d_Y)$, whereby the vector D designates the vectorial distance between the tip of the capillary 5 and the optical axis 8 of the image recognition system:

$$(x_2, y_2)=(x_1, y_1)+(d_X, d_Y).$$

During production, the vectorial distance D can vary in an unpredictable manner. Therefore, it is necessary to repeatedly re-calibrate the vectorial distance D. Because the capillary 5 is located outside the field of vision of the image recognition system, the position of the tip of the capillary 5 can not be directly determined with the image recognition system. Therefore, in accordance with the invention, a device is provided for determining the vector $D=(d_X, d_Y)$ which comprises a light-guiding glass fibre 10 by means of which co-ordinates $(x_A, y_A)$ of the optical axis 8 of the image recognition system as well as co-ordinates $(x_C, y_C)$ of the tip of the capillary 5 can be determined.

FIG. 2 shows a cross-section of the device. The device basically consists of the glass fibre 10, a light source 11, a beam splitter 12 and an opto-receiver 13. The glass fibre 10 guides the light in both directions. The light emitted by the light source 11 is fed into one end 15 of the glass fibre 10 by means of an optical system which comprises at least one lens 14. The glass fibre 10 is arranged so that the light beam emerging from the other end 16 of the glass fibre 10 runs orthogonally to the plane 6. When the capillary 5, at the tip of which the wire is formed into a ball 17, the so-called free air ball, is located above the glass fibre 10, then the wire ball 17 reflects a part of the light emerging from the glass fibre 10 back into the glass fibre 10. The beam splitter 12 positioned between the light source 11 and the end 15 of the glass fibre 10 serves to spatially separate the light reflected back from the light supplied from the light source 11 so that the intensity of the light reflected back by the wire ball 17 into the glass fibre 10 can be measured by means of the opto-receiver 13. The direction of the light is represented by arrows. The optical efficiency of the device is at its maximum when the beam splitter 12 lets through 50% of the impinging light and reflects 50% of the impinging light. When the light from the light source 11 and the sensitivity of the opto-receiver 13 are large enough, then a customary glass plate can serve as the beam splitter 12 which is arranged at an angle of 45°. As is generally known, with a glass plate the ratio of let-through to reflected light lies at around 4%. Therefore, on using a customary glass plate, the light efficiency is only reduced by a factor of approximately 6.5 as compared with a 50:50 beam splitter. In order to increase the efficiency of the measuring system, the light source 11 is preferably modulated or operated intermittently with impulses and the opto-receiver 13 synchronised accordingly.

A single mode fibre is used for example as the glass fibre 10, the core diameter of which only amounts to around 4.5 $\mu$m. Because the surface of the wire ball 17 is round, the most light is reflected back into the glass fibre 10 when the centre of the wire ball 17 is located exactly above the glass fibre 10. For this reason, during measuring, the wire ball 17 is led past as close as possible to the glass fibre 10. The end 16 of the glass fibre 10 is preferably flush with the surface of the gliding plate 9.

Determining the vector $D=(d_X, d_Y)$ is done according to the following steps:

1. A wire ball 17 is formed at the tip of the capillary 5.
2. The bondhead 1 moves the capillary 5 over the end of the glass fibre 10. In doing so, the co-ordinates (x, y) of the bondhead 1 and the intensity I(x, y) of the light reflected back are continuously measured and saved. Afterwards, those co-ordinates $(x_C, y_C)$ at which the bondhead 1 has to be placed in order that the intensity I of the light reflected back is at a maximum are determined from the intensity distribution I(x, y).
3. The bondhead 1 is moved until the glass fibre 10 is located in the field of vision of the image recognition system. The core of the glass fibre 10 now appears in the image provided by the camera 7 as a circular area which clearly distinguishes itself from the remaining part of the glass fibre which surrounds it. From the image provided by the camera 7, those co-ordinates $(x_A, y_A)$ of the bondhead 1 are now determined at which the bondhead 1 has to be positioned in order that the optical axis 8 of the image recognition system passes through the centre of the core of the glass fibre 10.
4. The vector D can now be calculated as:

$$D=(d_X, d_Y)=(x_C, y_C)-(x_A, y_A), \text{ i.e. } d_X=x_C-x_A \text{ and } d_Y=y_C-y_A.$$

Determining the co-ordinates $(x_C, y_C)$ in step 2 can be done, for example, in that the bondhead 1 scans the glass fibre 10 in predefined steps $\Delta x$ and $\Delta y$, whereby at each step, the co-ordinates of the bondhead 1 and the output signal I of the opto-receiver 13 are acquired and whereby the co-ordinates $(x_C, y_C)$ are subsequently determined from the measured values by means of determining the position of the maximum.

Determining the co-ordinates $(x_A, y_A)$ in step 3 is preferably done without the glass fibre 10 being supplied with light from the light source 11, ie, with the light source 11 switched off.

As it is recommended to carry out calibration of the distance D at regular intervals, it is preferred that the measuring system be permanently installed on the Wire Bonder.

The new calibration procedure has been described for a bondhead which is moved in the xy plane by means of two drives aligned in x and y direction. The calibration procedure can be used in an analogous manner for a rotational bondhead. With a rotational bondhead, other co-ordinates are used instead of the Cartesian co-ordinates x and y, whereby the calculation of the vectorial distance D is then differently.

The device described in the example is formed from customary optical components—glass fibre 10, beam splitter 12, lens 14. A complete fibre optic solution is also possible with which the glass fibre and beam splitter are one single fibre optic component. For the light source 11, a so-called pigtail diode for example can be connected to the fibre optic component, whereby the lens 14 is then omitted.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. Method for determining a vectorial distance D between a tip of a capillary and an optical axis of an image recognition system of a Wire Bonder, whereby the capillary and the optical axis of the image recognition system can be moved together in a plane by means of a bondhead, the method comprising the following steps:

Forming a wire ball at the tip of the capillary;

Moving the bondhead in such a way that the capillary is moved over a first end of a glass fibre, a second end of the glass fibre being supplied with light from a light source, in order to determine first co-ordinates at which the bondhead has to be positioned in order that an intensity of the light reflected by the wire ball back into the glass fibre is at a maximum;

Moving the bondhead in order to bring the first end of the glass fibre into a field of vision of the image recognition system and determining second co-ordinates at which the bondhead has to be positioned in order that the optical axis of the image recognition system passes through a centre of the glass fibre; and Determining the vectorial distance D from the first and second co-ordinates.

2. Method according to claim 1, wherein the light source is switched off for determining the second co-ordinates.

* * * * *